US011127753B2

(12) United States Patent
Yamamoto

(10) Patent No.: US 11,127,753 B2
(45) Date of Patent: Sep. 21, 2021

(54) SEMICONDUCTOR STORAGE DEVICE AND SEMICONDUCTOR STORAGE DEVICE MANUFACTURING METHOD

(71) Applicant: Kioxia Corporation, Minato-ku (JP)

(72) Inventor: Koichi Yamamoto, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 28 days.

(21) Appl. No.: 16/816,374

(22) Filed: Mar. 12, 2020

(65) Prior Publication Data

US 2021/0057443 A1 Feb. 25, 2021

(30) Foreign Application Priority Data

Aug. 21, 2019 (JP) .............................. JP2019-151443

(51) Int. Cl.
*H01L 27/11573* (2017.01)
*H01L 27/11582* (2017.01)
*H01L 21/768* (2006.01)
*H01L 27/11526* (2017.01)

(52) U.S. Cl.
CPC .. *H01L 27/11573* (2013.01); *H01L 21/76802* (2013.01); *H01L 21/76877* (2013.01); *H01L 27/11526* (2013.01); *H01L 27/11582* (2013.01)

(58) Field of Classification Search
CPC ............. H01L 21/768; H01L 21/76802; H01L 21/76805; H01L 21/76829; H01L 21/76831; H01L 21/76877; H01L 21/76885; H01L 21/8229; H01L 21/8239; H01L 27/115; H01L 27/11517; H01L 27/11521; H01L 27/11524; H01L 27/11526; H01L 27/11529; H01L 27/11551; H01L 27/11563; H01L 27/11568; H01L 27/1157; H01L 27/11573; H01L 27/11578; H01L 27/11582; H01L 27/1159; H01L 27/11592; H01L 27/11597
See application file for complete search history.

(56) References Cited

U.S. PATENT DOCUMENTS

| 10,199,511 B1 | 2/2019 | Nakaki |
| 2010/0013049 A1 | 1/2010 | Tanaka et al. |
| 2011/0201167 A1 | 8/2011 | Satonaka et al. |

FOREIGN PATENT DOCUMENTS

| JP | 2010-027870 A | 2/2010 |
| JP | 2011-166061 A | 8/2011 |
| JP | 2018-163981 A | 10/2018 |
| JP | 2019-050269 A | 3/2019 |

*Primary Examiner* — Cheung Lee
(74) *Attorney, Agent, or Firm* — Oblon, McClelland, Maier & Neustadt, L.L.P.

(57) ABSTRACT

A semiconductor storage device of the embodiment includes a stacked body in which a plurality of conductive layers and a plurality of insulating layers are alternately stacked, the stacked body including a stepped portion in which ends of the plurality of conductive layers are stepped, a pillar penetrating the stacked body, the pillar having a memory cell at a height position of each of the plurality of conductive layers, a contact disposed at the stepped portion, the contact being connected to an n-th conductive layer when counted from a lowermost conductive layer of the plurality of conductive layers, and a region in an (n−1)th conductive layer when counted from the lowermost conductive layer of the plurality of conductive layers, the region being disposed at a position below the contact, the region being insulated from the (n−1)th conductive layer surrounding a periphery.

20 Claims, 13 Drawing Sheets

TO STEPPED PORTION ⟶

⟵ TO CELL ARRAY REGION

← TO CELL ARRAY REGION

← TO CELL ARRAY REGION

TO STEPPED PORTION →

← TO CELL ARRAY REGION

SEMICONDUCTOR STORAGE DEVICE AND SEMICONDUCTOR STORAGE DEVICE MANUFACTURING METHOD

CROSS-REFERENCE TO RELATED APPLICATIONS

This application is based upon and claims the benefit of priority from Japanese Patent Application No. 2019-151443, filed on Aug. 21, 2019; the entire contents of which are incorporated herein by reference.

FIELD

Embodiments described herein relate generally to a semiconductor storage device and a method of manufacturing the semiconductor storage device.

BACKGROUND

In a three-dimensional nonvolatile memory, in order to draw out a plurality of conductive layers stacked, the end of each conductive layer is stepped, and a plurality of contacts is disposed at the end. In this case, it is necessary to suppress the contact from penetrating the conductive layer to be connected and short-circuiting with the lower conductive layer.

DETAILED DESCRIPTION

A semiconductor storage device of the embodiment includes a stacked body in which a plurality of conductive layers and a plurality of insulating layers are alternately stacked, the stacked body including a stepped portion in which ends of the plurality of conductive layers are stepped, a pillar penetrating the stacked body, the pillar having a memory cell at a height position of each of the plurality of conductive layers, a contact disposed at the stepped portion, the contact being connected to an n-th conductive layer when counted from a lowermost conductive layer of the plurality of conductive layers, and a region in an (n−1)th conductive layer when counted from the lowermost conductive layer of the plurality of conductive layers, the region being disposed at a position below the contact, the region being insulated from the (n−1)th conductive layer surrounding a periphery.

Hereinafter, the present invention will be described in detail with reference to the drawings. In addition, the present invention is not limited by the following embodiment. In addition, constituent elements in the following embodiments include those that can be easily assumed by those skilled in the art or those that are substantially the same.

First Embodiment

Hereinafter, the first embodiment will be described in detail with reference to the drawings.

Configuration Example of Semiconductor Storage Device

Figure 1A:
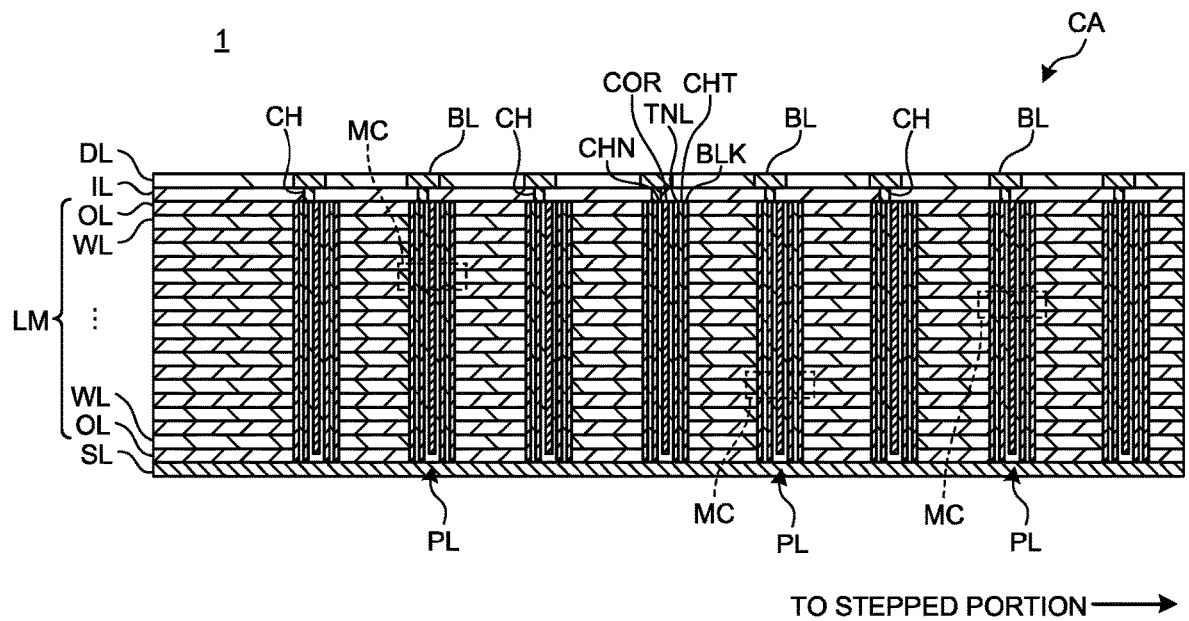
FIGS. 1A and 1B are cross-sectional views illustrating a configuration example of a semiconductor storage device according to a first embodiment.
Figure 1B:
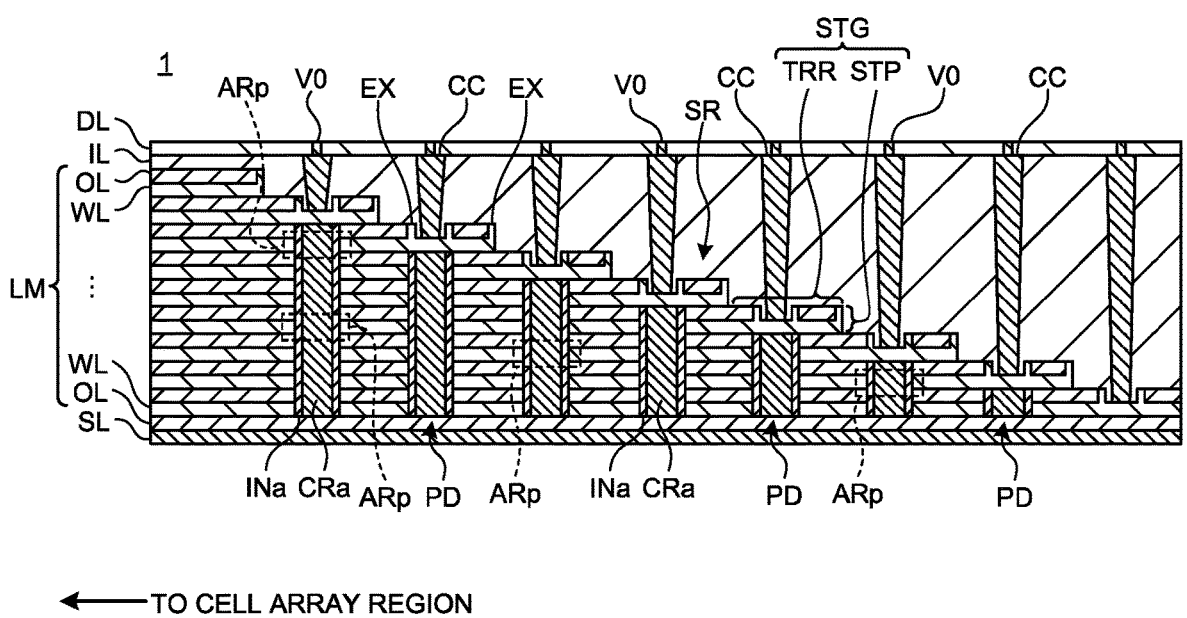

FIGS. 1A and 1B are cross-sectional views illustrating a configuration example of the semiconductor storage device 1 according to the first embodiment. Note that the vertical direction in a semiconductor storage device 1 of the first embodiment is defined based on the shape of a stepped portion SR described later. Specifically, the direction in which a terrace portion TRR of the stepped portion SR, that is, the exposed surface of an insulating layer OL in each stage of the stepped portion SR, is directed is defined as an upward direction in the semiconductor storage device 1.

As illustrated in FIGS. 1A and 1B, the semiconductor storage device 1 includes a source line SL. The source line SL, in which, for example, a p-well is provided in an n-well, is a semiconductor substrate such as a silicon wafer that functions as the source line SL. Alternatively, the source line SL may be separately provided above the substrate. In this case, the source line SL is made of a conductive material such as polysilicon. In this case, a peripheral circuit that contributes to the operation of a memory cell MC, which will be described later, may be disposed between the substrate and the source line.

A stacked body LM in which word lines WL as a plurality of conductive layers and a plurality of insulating layers OL are alternately stacked is disposed on the source line SL. The word line WL is made of a conductor such as tungsten. The insulating layer OL is made of an insulating material such as SiO$_2$. The stacked number of the word lines WL is any number. The insulating layer OL is disposed between the word lines WL with any number of the layers.

The stacked body LM has a cell array region CA near the center. A plurality of pillars PL is disposed in the cell array region CA. Each pillar PL penetrates the stacked body LM in the stacking direction of the stacked body LM. In the pillar PL, a block insulating layer BLK, a charge storage layer CHT, a tunnel insulating layer TNL, and a channel layer CHN are disposed in this order from the inner wall side of the pillar PL. The channel layer CHN is also disposed on the bottom face of the pillar PL and connected to the source line SL. A core layer COR is filled further inside the channel layer CHN in the pillar PL.

The block insulating layer BLK, the tunnel insulating layer TNL, and the core layer COR are made of, for example, SiO$_2$. The charge storage layer CHT is made of, for example, SiN. The channel layer CHN is made of, for example, α-Si or polysilicon.

An interlayer insulating layer IL having a contact CH is disposed on the stacked body LM. An insulating layer DL having a bit line BL is disposed on the interlayer insulating layer IL. The contact CH that penetrates the interlayer insulating layer IL connects the channel layer CHN of the pillar PL and the bit line BL of the insulating layer DL.

With this configuration, a memory cell MC is formed at the intersection of each word line WL and each pillar PL at the height position of each word line WL. Data is written to the memory cell MC in a nonvolatile manner when, for example, a charge is stored in the charge storage layer CHT of the memory cell MC by applying a predetermined voltage from the word line WL. In addition, by applying a predetermined voltage from the word line WL, data stored in the memory cell MC is read to the bit line BL.

However, some word lines WL including the uppermost and the lowermost word line WL of the stacked body LM may function as selection gate lines. A selection gate instead of the memory cell MC is formed at the intersection portion of the selection gate line and the pillar PL. By turning the selection gate on or off, the memory cell MC of the pillar PL to which the selection gate belongs can be set to a selected state or a non-selected state.

The stacked body LM has the stepped portion SR near the outer edge. In the stepped portion SR, the end portions of the plurality of word lines WL are terminated in a step shape. The stepped portion SR is stepped up by, for example, one word line WL layer toward the cell array region CA.

A contact CC is disposed on each stage of the stepped portion SR. The contact CC is made of a metal such as tungsten. The stepped portion SR is covered with the above-described interlayer insulating layer to a height equal to, for example, that of the upper face of the stacked body LM. The contact CC penetrates the interlayer insulating layer IL and the insulating layer OL exposed at the upper face in each step, and is connected to the word line WL under the insulating layer OL.

The above-described insulating layer DL having a contact V0 is disposed on the interlayer insulating layer IL. The contact V0 penetrating the insulating layer DL connects the contact CC and upper layer wiring (not illustrated). By configuring the stepped portion SR in this way, respective word lines WL can be drawn out at the end of the stacked body LM.

A pedestal PD is disposed below the contact CC at a position overlapping the position where the contact CC is disposed in a top view. However, it is desirable that the diameter of the pedestal PD be larger than at least the diameter of the bottom face of the contact CC.

The pedestal PD penetrates the lowermost word line WL of the stacked body LM from the insulating layer OL under the word line WL to which the contact CC is connected to reach the lower insulating layer OL. That is, the contact CC and the pedestal PD face each other in the stacking direction of the stacked body LM with the word lines WL, to which the contact CC is connected, interposed therebetween.

The pedestal PD includes an insulating member INa made of, for example, SiO$_2$ and a conductive member CRa made of, for example, α-Si. The insulating member INa is thinly disposed along the inner wall face of the pedestal PD. The conductive member CRa is filled further inside the insulating member INa.

Thereby, for example, the word line WL which the pedestal PD penetrates has an insulating region ARp. The insulating region ARp is a region occupied by the pedestal PD in the word line WL. In other words, the insulating region ARp is a region partitioned by the insulating member INa surrounding the conductive member CRa. Being surrounded by the insulating member INa, the insulating region ARp is insulated from the surrounding word line WL.

Each stage STG of the stepped portion SR has a step portion STP composed of an end portions of the terminated word line WL and the insulating layer OL thereon, and the terrace portion TRR whose insulating layer OL is exposed. The word line WL belonging to a predetermined stage STG of the stepped portion SR, that is, the word line WL to which the contact CC is to be connected at the stage STG, has a plurality of protrusions EX at the step portion STP and the terrace portion TRR.

More specifically, the protrusion EX of the word line WL protrudes to the step portion STP so as to cover the step portion STP. The other protrusions EX of the word line WL protrude into the insulating layer OL so as to cover the periphery of the contact CC penetrating the insulating layer OL constituting the terrace portion TRR of the stage STG, that is, the inner wall face of the insulating layer OL.

(Method of Manufacturing Semiconductor Storage Device)

Next, a method of manufacturing the semiconductor storage device 1 according to the first embodiment will be described with reference to FIGS. 2A to 6C. FIGS. 2A to 6C are flow diagrams illustrating an example of the procedure of the method of manufacturing the semiconductor storage device 1 according to the first embodiment. Note that the lower layer structure of the semiconductor storage device 1 may have any of the above-described configurations, and is illustrated as an underlayer UL in FIGS. 2A to 6C.

Hereinafter, a method of forming the pillar PL and a method of forming the stepped portion SR will be sequentially described. First, a method of forming the pillar PL will be described.

Figure 2A:
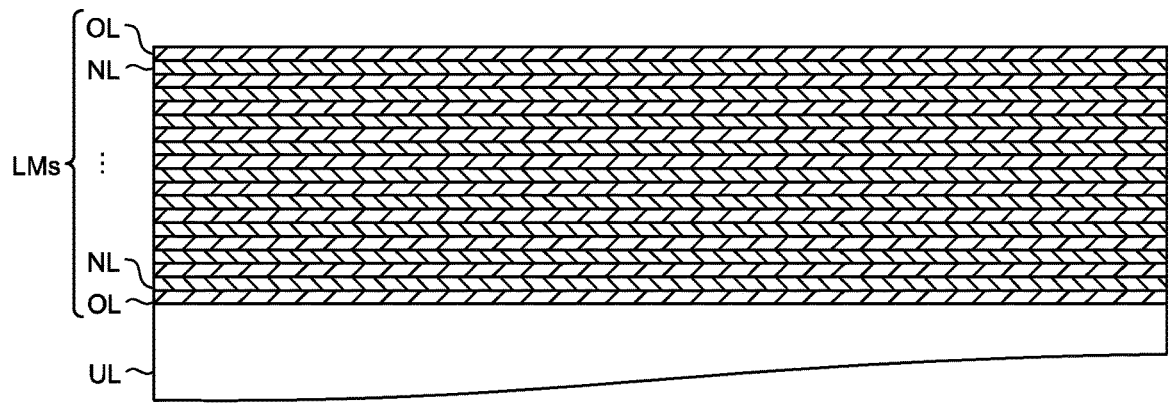
FIGS. 2A to 2C are flow diagrams illustrating an example of a procedure of a method of manufacturing the semiconductor storage device according to the first embodiment.

As illustrated in FIG. 2A, a stacked body LMs in which sacrificial layers NL as a plurality of insulating layers, and a plurality of insulating layers OL are alternately stacked is formed on the underlayer UL such as the source line SL (see FIGS. 1A and 1B). The sacrificial layer NL is a layer that is the word line WL in a replacement process described later, and, for example, is made of SiN or the like that can be replaced with a conductor such as tungsten.

Figure 2B:
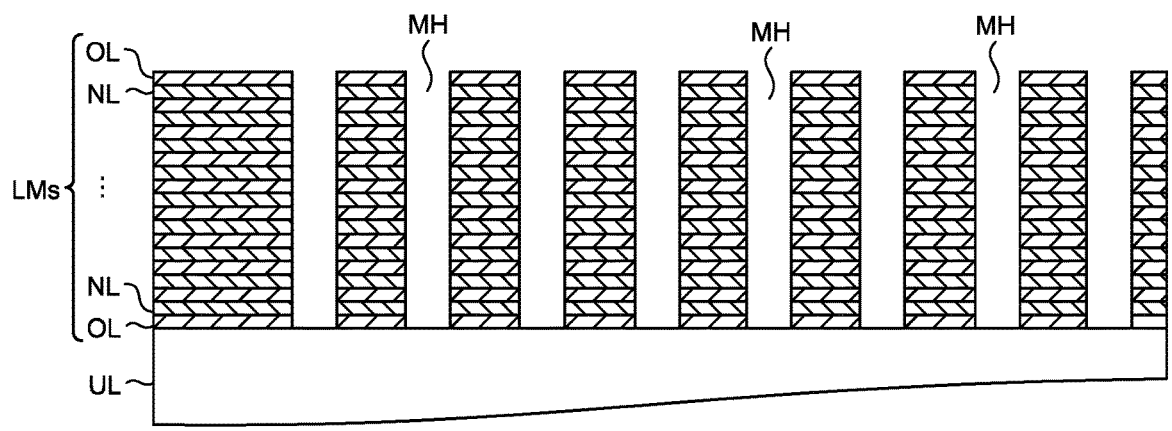

As illustrated in FIG. 2B, a plurality of memory holes MH penetrating the stacked body LMs and reaching the underlayer UL is formed.

Figure 2C:
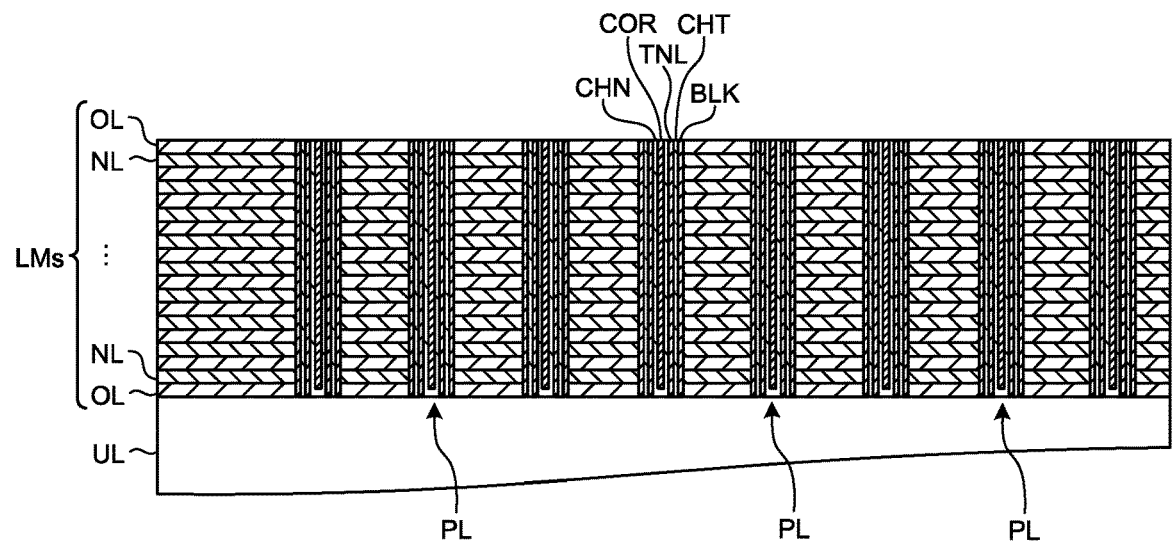

As illustrated in FIG. 2C, in each memory hole MH, the block insulating layer BLK, the charge storage layer CHT, the tunnel insulating layer TNL, the channel layer CHN, and the core layer COR are sequentially formed from the inner wall side of the memory hole MH. The channel layer CHN is also formed on the bottom face of the memory hole MH. Thus, the plurality of pillars PL is formed.

Next, a method of forming the stepped portion SR will be described.

Figure 3A:
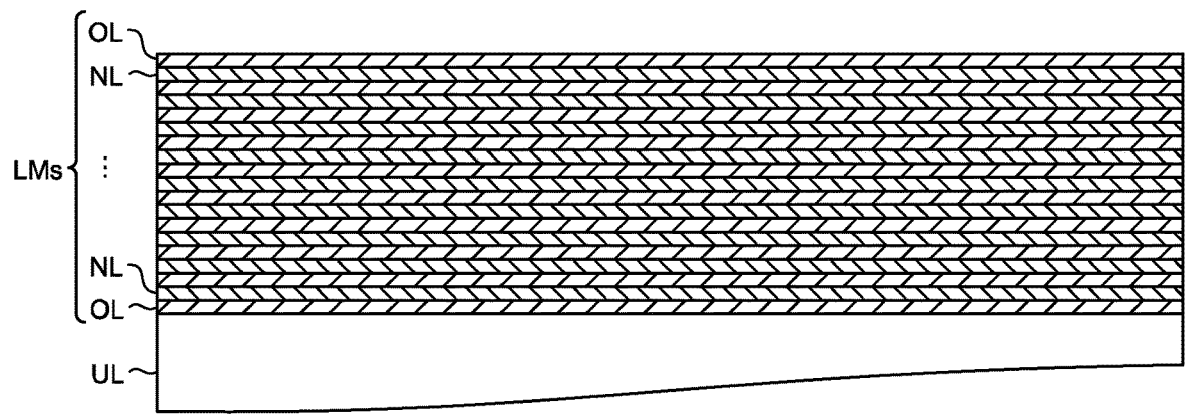
FIGS. 3A to 3C are flow diagrams illustrating an example of the procedure of the method of manufacturing the semiconductor storage device according to the first embodiment.

As illustrated in FIG. 3A, a stacked body LMs formed in the cell array region CA is formed to extend to the region that is the stepped portion SR.

Figure 3B:
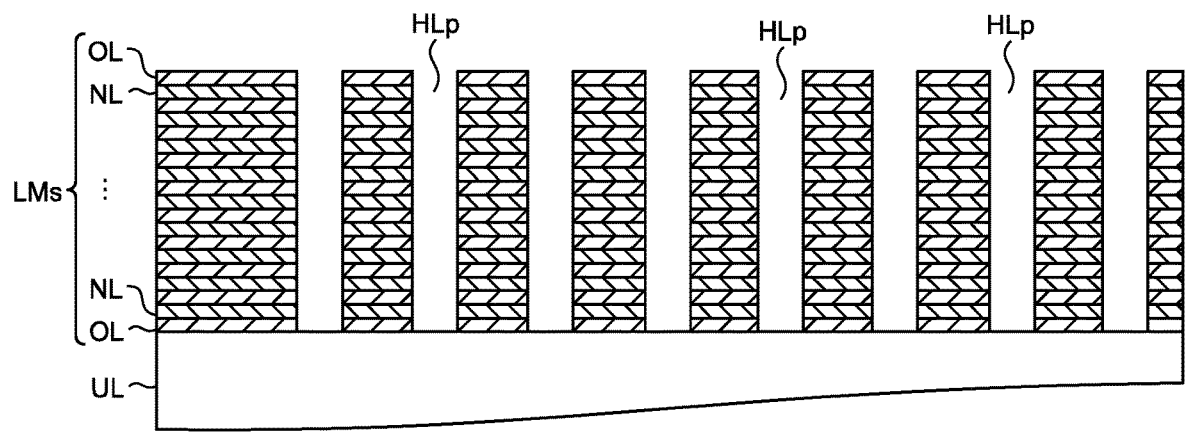

As illustrated in FIG. 3B, a plurality of through holes HLp that penetrates the stacked body LMs and reach the lowermost insulating layer OL is formed.

Figure 3C:
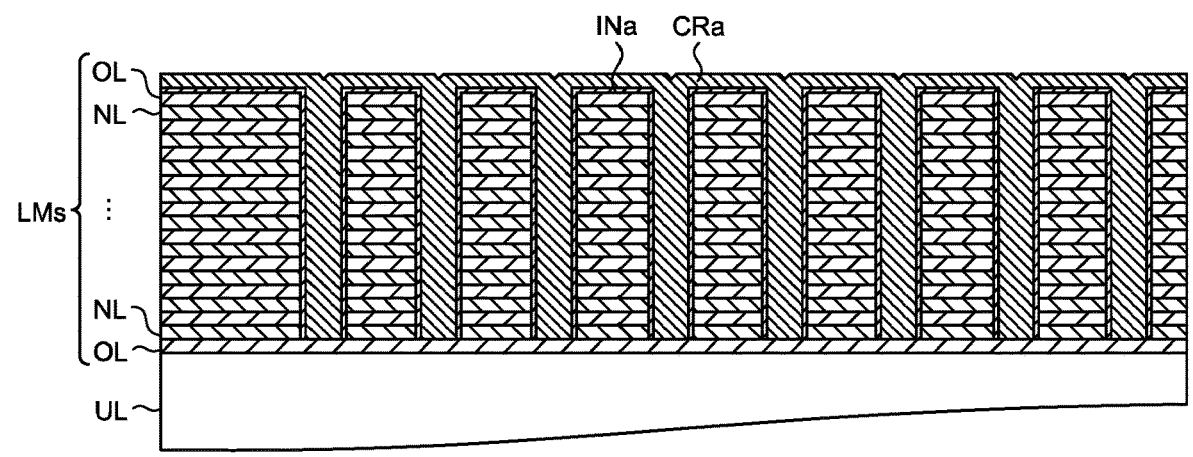

As illustrated in FIG. 3C, the insulating member INa is formed so as to cover the uppermost insulating layer OL of the stacked body LMs. At this time, the insulating member INa is also formed on the inner wall of the through hole HLp. The insulating member INa is formed sufficiently thin so that the through hole HLp is not filled with the insulating member INa.

Further, the conductive member CRa is formed so as to cover the insulating member INa on the insulating layer OL and on the inner wall face of the through hole HLp. At this time, the conductive member CRa is formed sufficiently thick so that the through hole HLp is filled with the conductive member CRa.

Figure 4A:
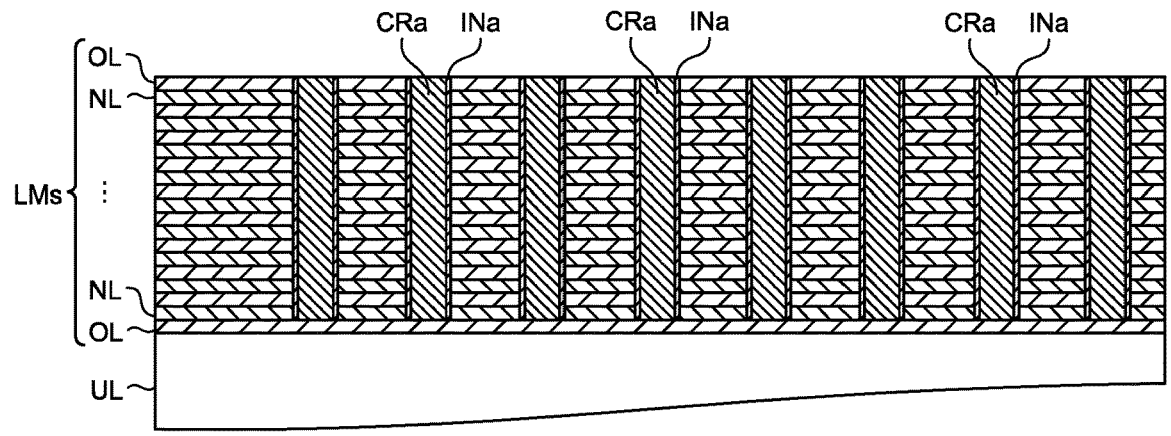
FIGS. 4A to 4C are flow diagrams illustrating an example of the procedure of the method of manufacturing the semiconductor storage device according to the first embodiment.

As illustrated in FIG. 4A, the conductive member CRa and the insulating member INa are etched back to expose the uppermost insulating layer OL of the stacked body LMs. Here, the conductive member CRa may be etched back using a condition having a high selectivity with respect to the insulating member INa, for example, using a chlorine-based gas, and further, the amount of etch back is adjusted so that the conductive member CRa and the insulating member INa in the through hole HLp are not removed.

Figure 4B:
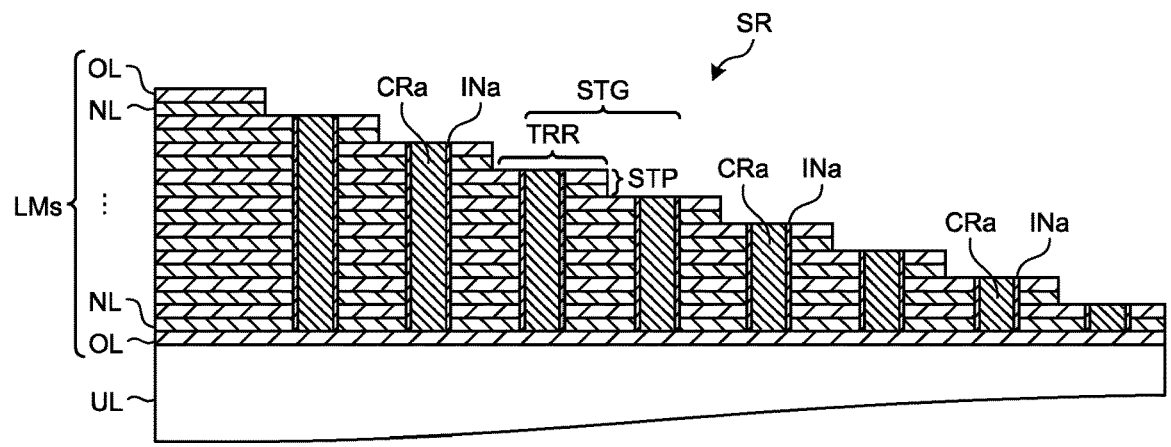

As illustrated in FIG. 4B, the stepped portion SR is formed in the stacked body LMs. Specifically, a resist (not illustrated) covering the entire surface of the cell array region CA and part of the region to be the stepped portion SR is formed, and the resist is receded by slimming while removing the stepped portion SR one by one, that is, pairs of the insulating layers OL and the sacrificial layers NL one by one at a time. Thereby, the stepped portion SR having a plurality of stages STG each having the step portion STP and the terrace portion TRR is formed.

At this time, along with the insulating layer OL and the sacrificial layer NL, the conductive member CRa and the insulating member INa with which the through hole HLp is filled also need to be removed. For this reason, for example, when the removal rate of the conductive member CRa is slow and the conductive member CRa has a protruding shape, additional etch back with, for example, chlorine-based gas is performed, and the height of the conductive member CRa and the insulating member INa in each stage is adjusted so as to be substantially equal to the height of the upper face of the terrace portion TRR in each stage. The conductive member CRa and the insulating member INa are exposed at terrace portion TRR composed of insulating layer OL at each stage.

Figure 4C:
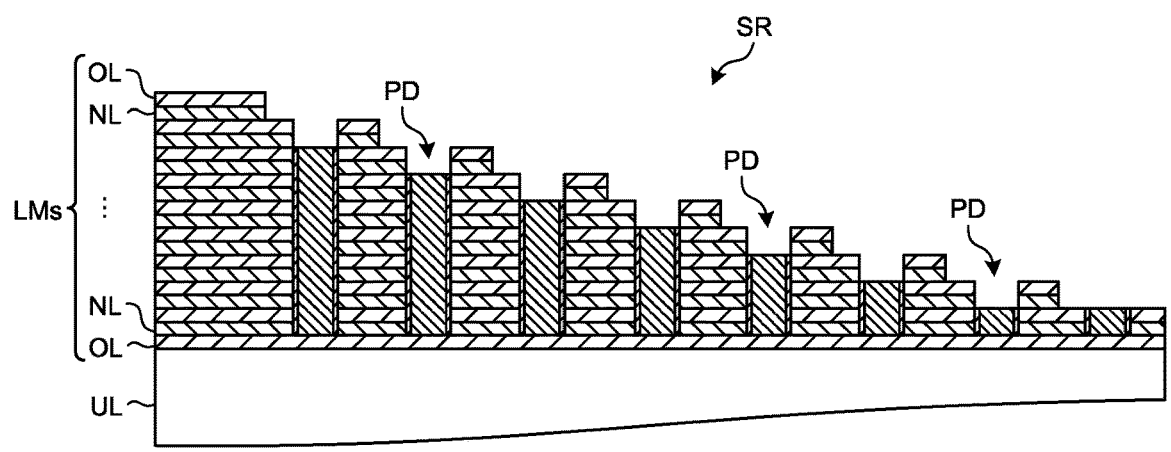

As illustrated in FIG. 4C, the conductive member CRa and the insulating member INa with which the through hole HLp is filled are etched back. This allows the conductive member CRa and the insulating member INa to be recessed to a predetermined depth position in the through hole HLp from the upper face of the terrace portion TRR, that is, from the edge of the through hole HLp. In addition, the insulating layer OL constituting the terrace portion TRR and the sacrificial layer NL under the insulating layer OL are exposed in the through hole HLp. In other words, a pair of the insulating layer OL and the sacrificial layer NL constituting one stage where a predetermined through hole HLp is disposed is exposed in the through holes HLp.

As described above, the pedestal PD is formed at each stage of the stepped portion SR.

Figure 5A:
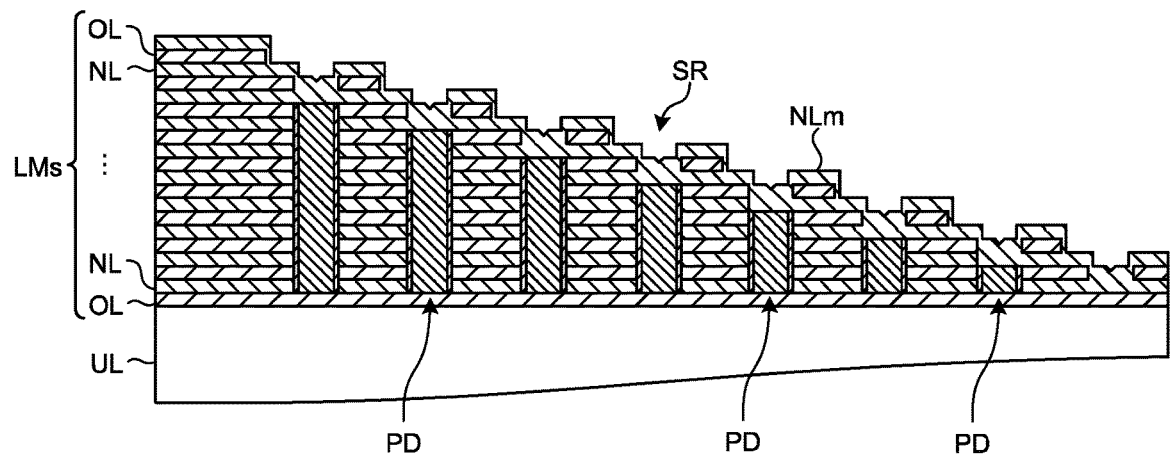
FIGS. 5A to 5C are flow diagrams illustrating an example of the procedure of the method of manufacturing the semiconductor storage device according to the first embodiment.

As illustrated in FIG. 5A, a sacrificial layer NLm that covers the entire stepped portion SR is formed. The sacrificial layer NLm covers the terrace portion TRR of each stage of the stepped portion SR, the inside of the through hole HLp including the pedestal PD recessed from the terrace portion TRR to a predetermined depth, and the step portion STP. Thereby, the sacrificial layer NLm fills up to the height of the insulating layer OL exposed in the through hole HLp.

Figure 5B:
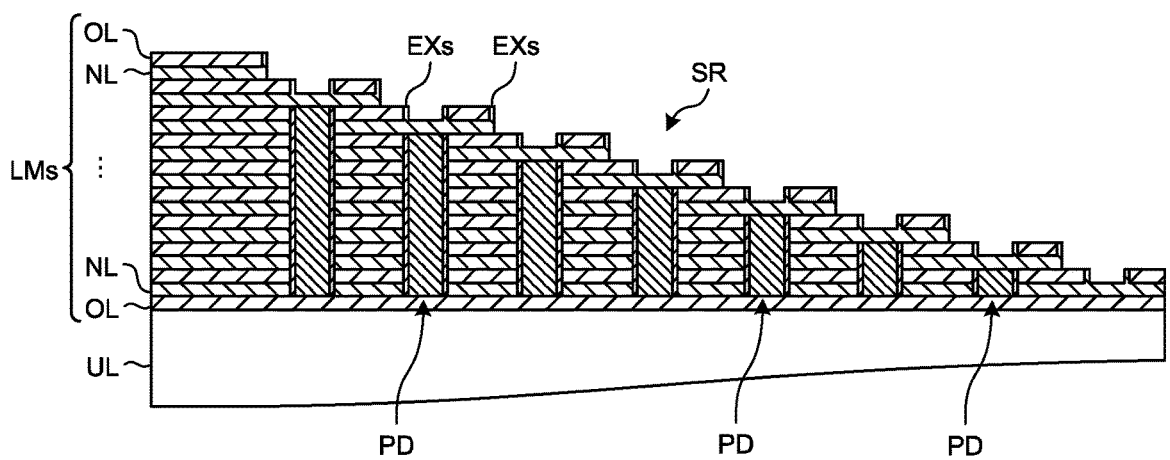

As illustrated in FIG. 5B, the sacrificial layer NLm covering the stepped portion SR is etched back. Thereby, the sacrificial layer NLm on the upper face of the terrace portion TRR is removed. Further, the sacrificial layer NLm in the through hole HLp is removed to the height position of the sacrificial layer NL exposed in the through hole HLp. In other words, the sacrificial layer NLm of the unnecessary portion such as the upper face of the terrace portion TRR is removed, and the hole of the through hole HLp generated in the sacrificial layer NL at each stage is backfilled. However, the sacrificial layer NL that has been backfilled has a protrusion EXs in the step portion STP and the through hole HLp.

Figure 5C:
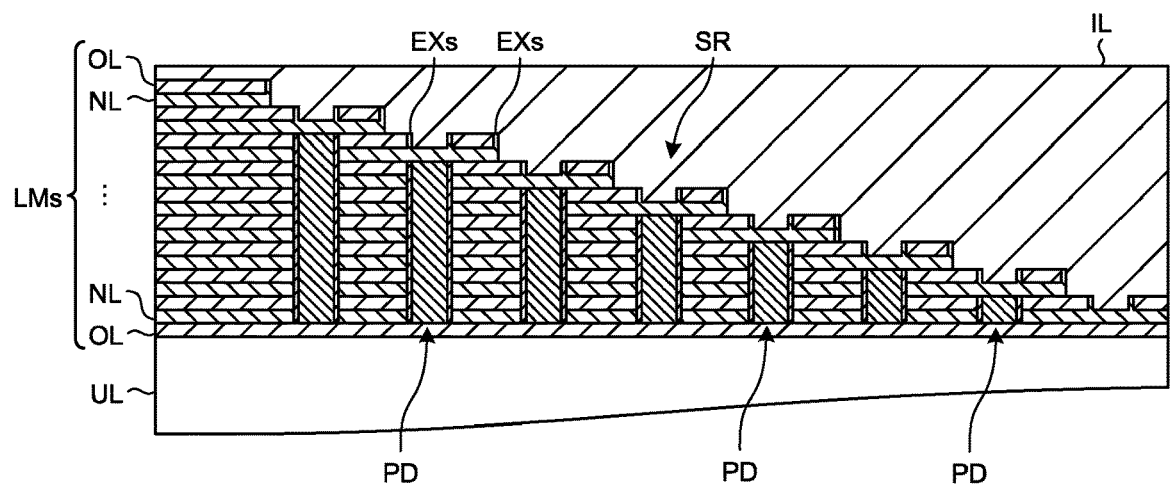

As illustrated in FIG. 5C, the interlayer insulating layer IL covering the entire stepped portion SR is formed. The interlayer insulating layer IL is formed, for example, to a height approximately equal to the height of the uppermost layer of the stacked body LMs in the cell array region CA.

Figure 6A:
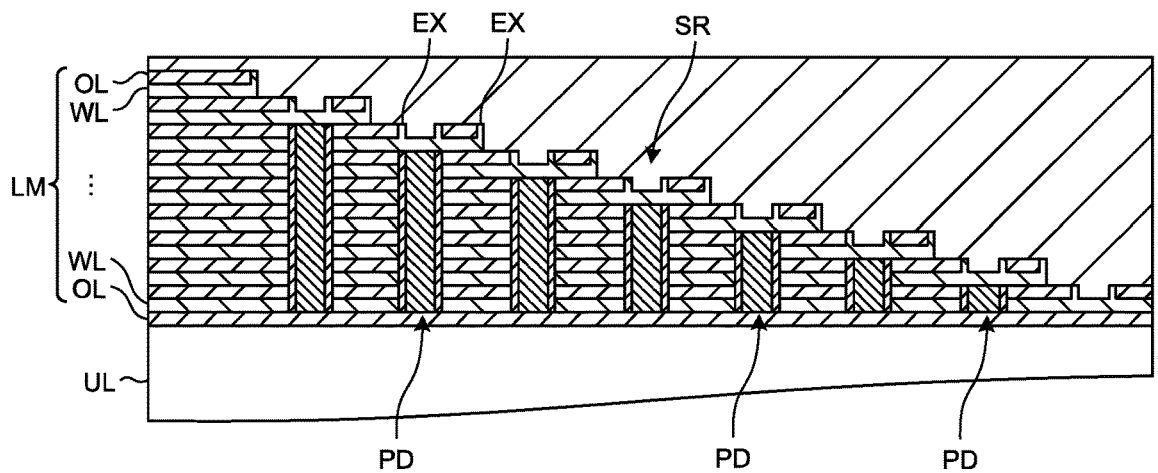
FIGS. 6A to 6C are flow diagrams illustrating an example of the procedure of the method of manufacturing the semiconductor storage device according to the first embodiment.

As illustrated in FIG. 6A, the word line WL is formed by removing the sacrificial layer NL between the insulating layers OL, and filling a space between the insulating layers OL with a conductor such as tungsten. The sacrificial layer NL is removed and the space is filled with the conductor through a slit (not illustrated). The slit is formed as a groove that penetrates the stacked body LMs and extends from the cell array region CA to the stepped portion SR. That is, the slit is formed in parallel with the cross section in FIG. 6A.

Thereby, the sacrificial layer NL from the cell array region CA to the stepped portion SR is replaced with the word line WL. At this time, the protrusion EXs included in each sacrificial layer NL are also replaced with the conductor, and the word line WL having the protrusion EX is formed. Further, by replacing the sacrificial layers NL of the entire stacked body LMs with the word lines WL, the stacked body LM in which the word lines WL and the insulating layers OL are alternately stacked is formed.

The above-described process for forming the word line WL by replacing the sacrificial layer NL with a conductor may be referred to as replacement.

Figure 6B:
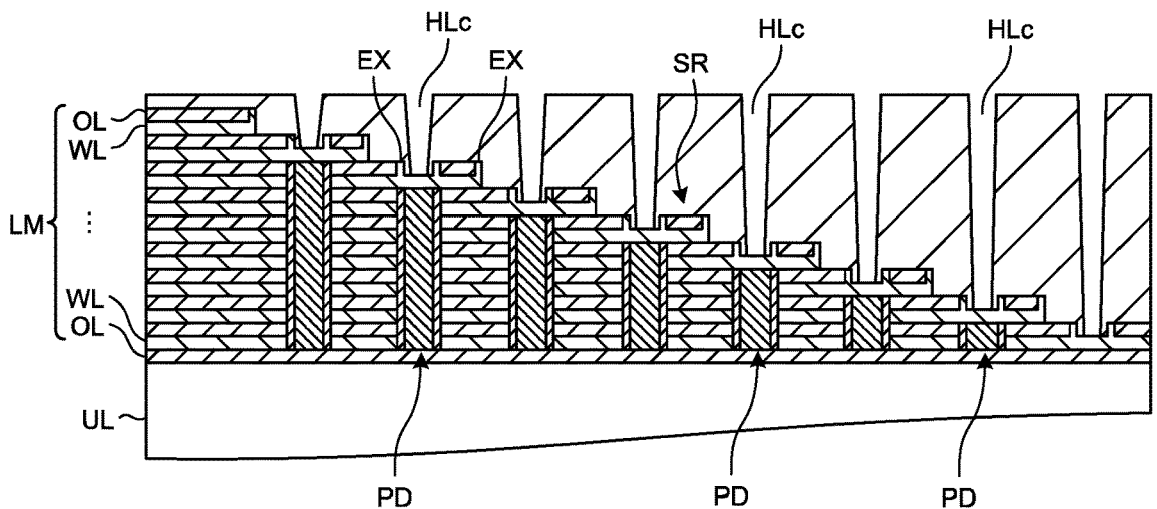

As illustrated in FIG. 6B, a through hole HLc penetrating the interlayer insulating layer IL and the insulating layer OL constituting the terrace portion TRR of each stage, and reaching the lower word line WL is formed. For example, the through holes HLc are collectively formed from the upper stage to the lower stage of the stepped portion SR. That is, the etching depths of the through holes HLc disposed at respective stages STG are different. For this reason, the through hole HLc is formed using a gas that has a high selectivity to the word line WL and that is, for example, a $C_4F_6/C_4F_4/Ar/O_2$ system. When a high selectivity is obtained with respect to the word line WL, for example, penetration through the word line WL to be reached is suppressed. When the etching condition is good for removal, the deep through hole HLc can be formed without stopping the etching halfway.

Figure 6C:
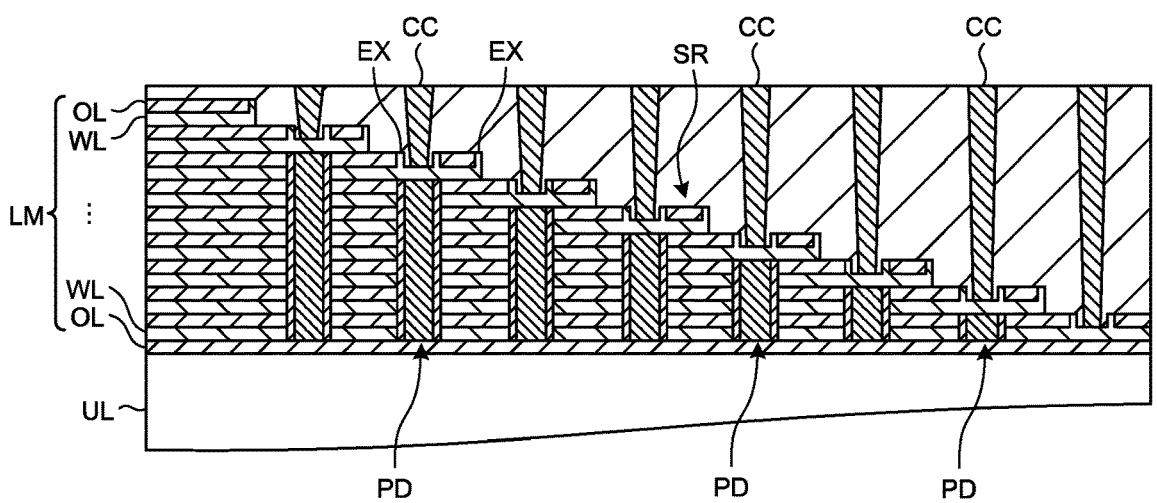

As illustrated in FIG. 6C, the through hole HLc is filled with a conductor such as tungsten, and the contact CC disposed at each stage is formed.

Thereafter, the insulating layer DL is formed on the interlayer insulating layer IL, an upper layer wiring or the like including the contact V0 (see FIGS. 1A and 1B) penetrating the insulating layer DL is formed. In the cell array region CA, the contact CH (see FIGS. 1A and 1B) connected to the channel layer CHN of the pillar PL, the bit line BL (see FIGS. 1A and 1B) disposed on the insulating layer DL, and the like are formed.

As described above, the semiconductor storage device 1 of the first embodiment is manufactured.

Note that either the formation of the pillar PL or the formation of the stepped portion SR may be performed first. For example, after the processing of FIGS. 5A to 5C is completed, the pillar PL of FIGS. 2A to 2C can be formed. Thereafter, replacement can be performed to form the word line WL.

Comparative Example

Figure 7A:
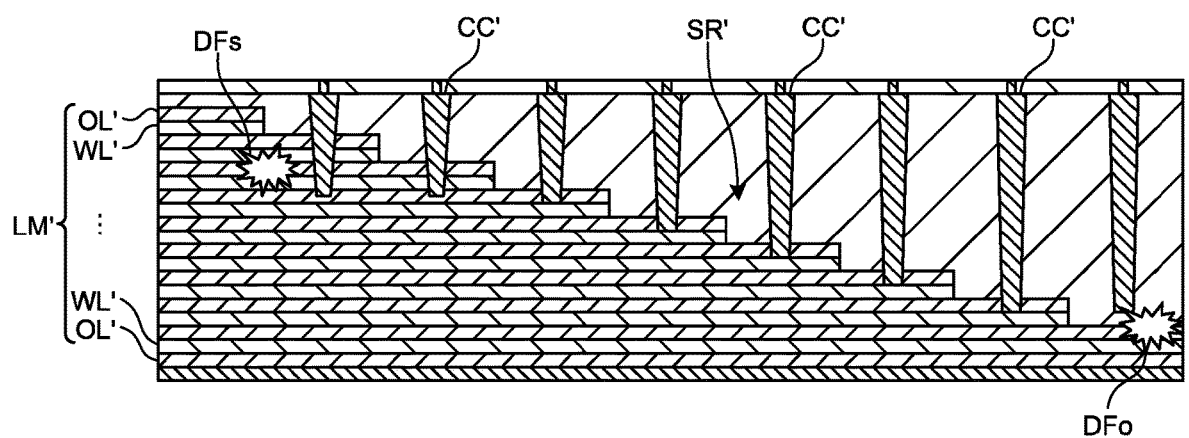
FIGS. 7A and 7B are cross-sectional views illustrating configuration examples of the semiconductor storage device according to the first embodiment and a comparative example.
Figure 7B:
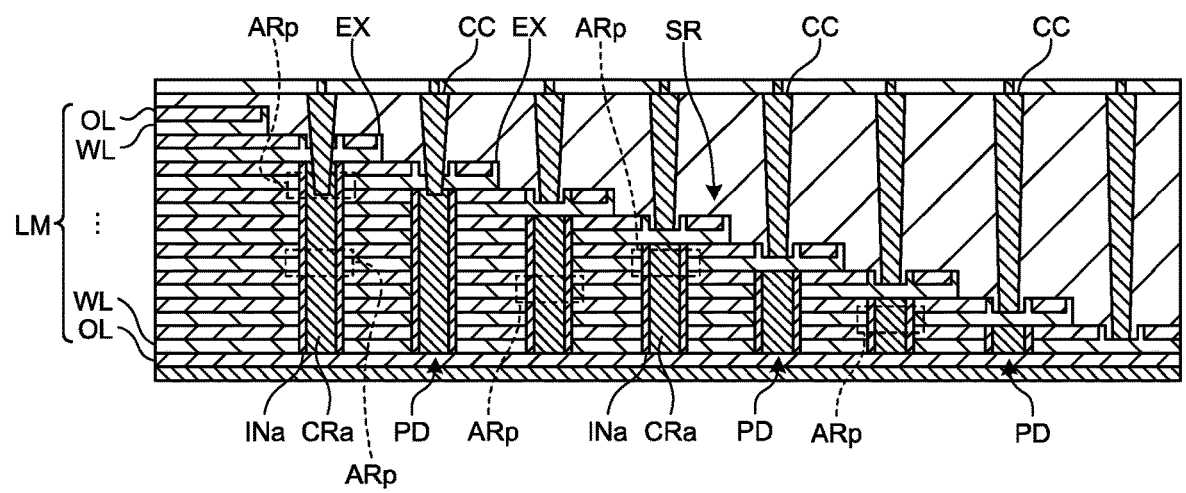

FIGS. 7A and 7B are cross-sectional views illustrating configuration examples of the semiconductor storage device according to the first embodiment and a comparative example. FIG. 7A is a cross-sectional view of a stepped portion SR' of the semiconductor storage device of the comparative example, and FIG. 7B is a cross-sectional view of the stepped portion SR of the semiconductor storage device 1 according to the first embodiment.

As illustrated in FIG. 7A, the semiconductor storage device of the comparative example does not have the pedestal PD below a contact CC' disposed at the stepped portion SR'. For this reason, when forming a through hole for forming the contact CC', the through hole may penetrate the word line WL' to be reached, and the bottom of the through hole may reach a lower word line WL'. When such a through hole is filled with a conductor to form the contact CC', the upper word line WL', that is, the word line WL' to be originally connected, and the lower word line WL' are electrically connected by the contact CC', causing a short circuit DFs.

To avoid this, it is also conceivable to use the etching condition with a higher selectivity for word line WL' when forming the through hole. However, there is a trade-off relationship between the etching condition with a high selectivity and the etching condition with good removability. For this reason, there is a possibility that the deep through hole may not reach the word line WL' to be reached in the lower stage of the stepped portion SR'. When such a through hole is filled with a conductor to form the contact CC', the contact CC' may not be connected to the word line WL' to be connected, resulting in an open defect DFo.

In this way, the semiconductor storage device of the comparative example may be in a trade-off state in which a through hole with a low aspect ratio penetrates the word line WL', and for a through hole with a high aspect ratio, etching stops.

According to the semiconductor storage device 1 of the first embodiment, the pedestal PD is provided below the contact CC with the word line WL to be connected to the contact CC interposed therebetween. For this reason, when the through hole HLc for forming the contact CC penetrates the target word line WL to be reached, the through hole HLc extends downward in the pedestal PD. The pedestal PD is the insulating region ARp surrounded by the insulating member INa. This allows the contact CC to be connected only to the penetrated word line WL to be connected, and conduction with the lower word line WL is suppressed.

According to the semiconductor storage device 1 of the first embodiment, even when the contact CC penetrates the word line WL to be connected, a short circuit with the lower word line WL is suppressed. As a result, when forming the through hole HLc, there is no need to employ the etching condition with an extremely high selectivity to the word line WL, and the etching condition in which sufficient removability is secured with the deep through hole HLc can be set. Therefore, an open defect in the word line WL belonging to the lower stage of the stepped portion SR can be suppressed using the etching condition with a wide process margin.

Modification

Next, the semiconductor storage device of the first and second modifications of the first embodiment will be described with reference to FIGS. 8A and 8B. In the semiconductor storage devices of the first and second modifications, the configurations of pedestals PDp and PDs are different from that of the first embodiment.

Figure 8A:
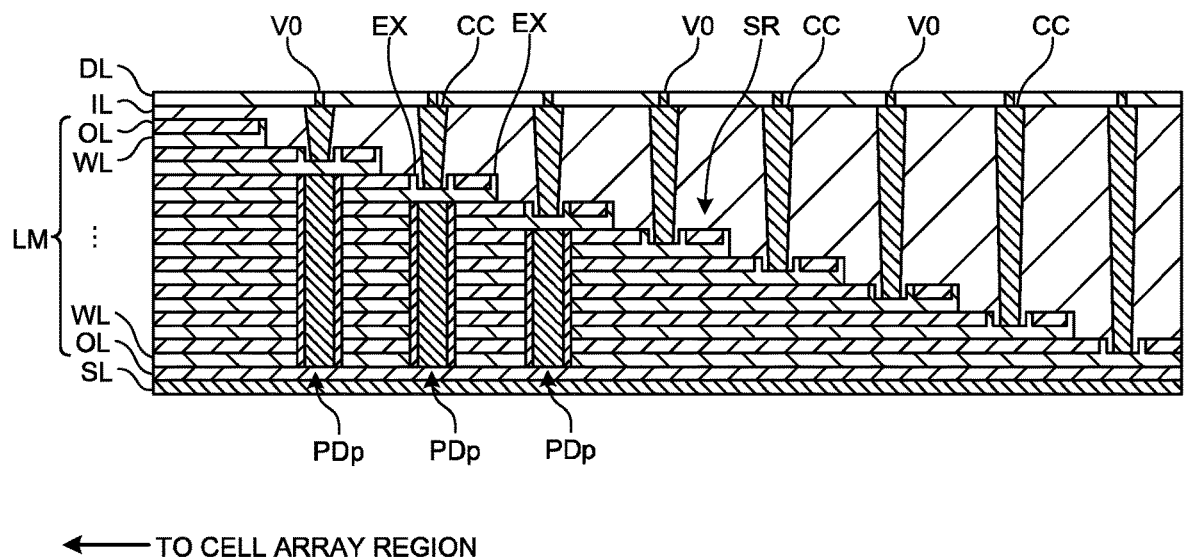
FIGS. 8A and 8B are cross-sectional views illustrating a configuration example of the semiconductor storage device according to first and second modifications of the first embodiment.
Figure 8B:
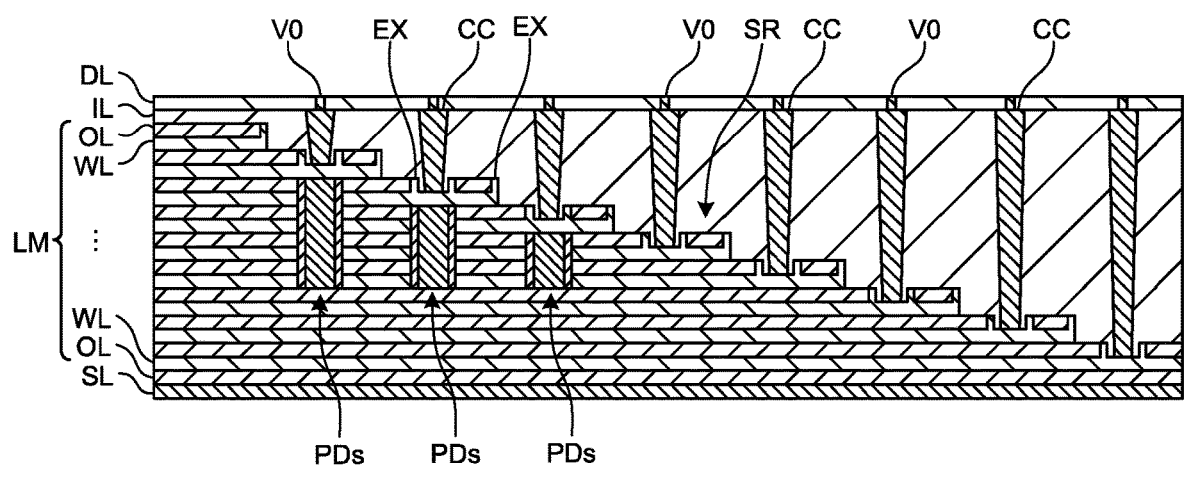

FIGS. 8A and 8B are cross-sectional views illustrating a configuration example of the semiconductor storage device according to first and second modifications of the first embodiment. FIG. 8A is a cross-sectional view of the stepped portion SR of the semiconductor storage device of the first modification, and FIG. 8B is a cross-sectional view of the stepped portion SR of the semiconductor storage device of the second modification.

When forming a through hole for forming the contact CC, unintended penetration through the word line WL is likely to occur mainly in the upper stage of the stepped portion SR and in the upper word line WL.

As illustrated in FIG. 8A, in the semiconductor storage device of the first modification, the pedestal PDp is disposed only at the stages from the uppermost stage to several stages below of the stepped portion SR. In this way, the semiconductor storage device of the first modification includes the pedestal PDp only at the upper stages of the stepped portion SR where the unintended penetration through the word line WL is likely to occur. Also in the configuration of the first modification, a short circuit of the word line WL can be suppressed.

As illustrated in FIG. 8B, in the semiconductor storage device of the second modification, as in the first modification, the pedestal PDs is disposed only at the stages from the uppermost stage to several stages below of the stepped portion SR. Moreover, the pedestal PDs extends from directly below the word line WL to be connected to the word line WL which is several layers below the word line WL to be connected. That is, the pedestal PDs does not reach the lowermost insulating layer OL of the stacked body LM. In this way, the semiconductor storage device of the second modification includes the pedestal PDs having a depth only to the upper word line WL in which unintended penetration through the word line is likely to occur. Also in the configuration of the second modification, a short circuit of the word line WL can be suppressed.

In this way, the configurations of the semiconductor storage devices of the first and second modifications can be applied to, for example, a case where an unintended penetration through the word line WL is likely to occur in the upper stage of the stepped portion SR and the upper word line WL.

Second Embodiment

Hereinafter, the second embodiment will be described in detail with reference to the drawings. In a semiconductor storage device 2 of the second embodiment, a pedestal PDb below the contact CC is made of a material different from that of the first embodiment.

Configuration Example of Semiconductor Storage Device

Figure 9A:
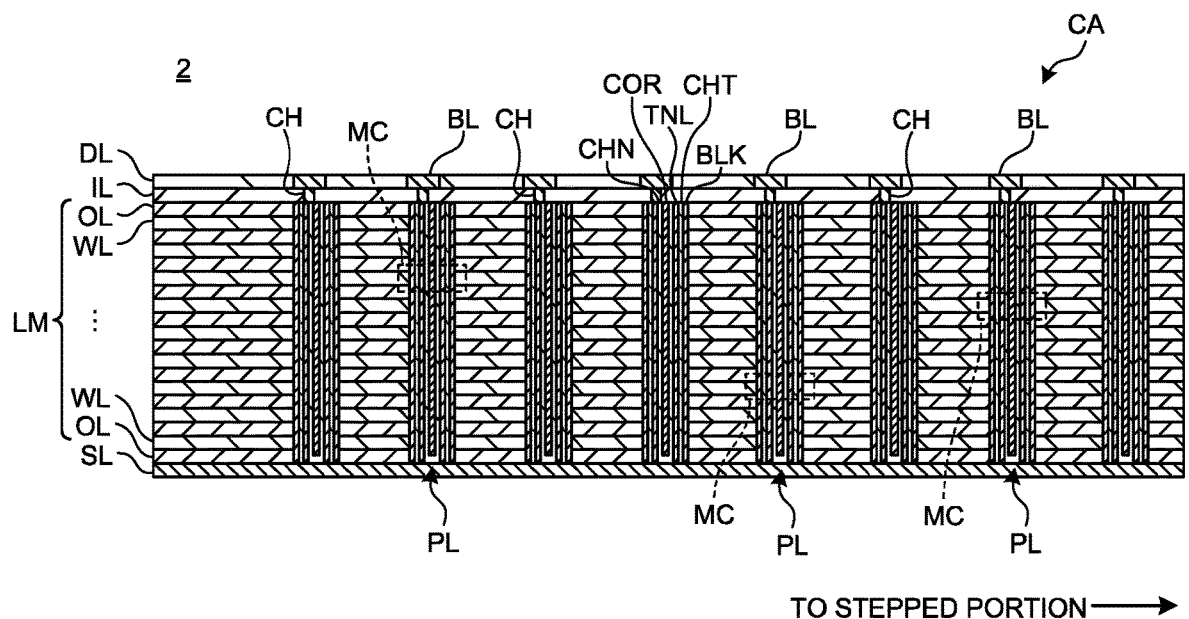
FIGS. 9A and 9B are cross-sectional views illustrating a configuration example of a semiconductor storage device according to a second embodiment.
Figure 9B:
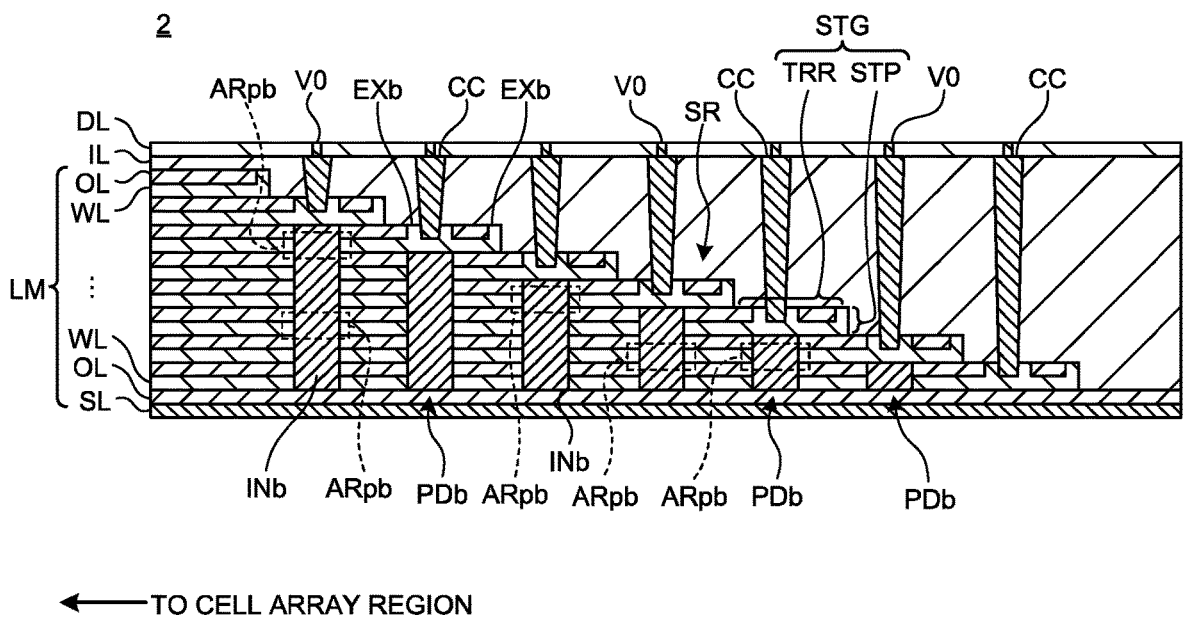

FIGS. 9A and 9B are cross-sectional views illustrating a configuration example of the semiconductor storage device 2 according to the second embodiment. Note that the vertical direction in the semiconductor storage device 2 of the second embodiment is also defined with the direction in which the terrace portion TRR of the stepped portion SR is directed as the upward direction.

As illustrated in FIGS. 9A and 9B, in the cell array region CA, a plurality of pillars PL, a plurality of contacts CH, a plurality of bit lines BL, and the like having the same configuration as the cell array region CA of the first embodiment are disposed.

In the stepped portion SR, the pedestal PDb is disposed below the contact CC of each stage. The pedestal PDb is filled with an insulating member INb. The insulating member INb is made of, for example, $SiO_2$.

Thereby, for example, the word line WL which the pedestal PDb penetrates has an insulating region ARpb. The insulating region ARpb is a region occupied by the pedestal PDb in the word line WL. In other words, the insulating region ARpb is a region partitioned by the insulating member INb with which the pedestal PDb is filled. Thereby, the insulating region ARpb is insulated from the word line WL surrounding the periphery.

The word line WL belonging to a predetermined stage of the stepped portion SR, that is, the word line WL to which the contact CC is to be connected at the stage, has a plurality of protrusions EXb at the step portion STP and the insulating layer OL of the terrace portion TRR.

More specifically, the protrusion EXb of the word line WL protrudes to the step portion STP so as to cover the step portion STP. In addition, the other protrusions EXb of the word line WL protrude into the insulating layer OL so as to penetrate the insulating layer OL constituting the terrace portion TRR of the stage.

The contact CC disposed at each stage of the stepped portion SR penetrates the protrusion EXb protruding into the insulating layer OL to reach the lower word line WL. However, it is only necessary that the bottom face of the contact CC reaches the protrusion EXb. Even in this case, it is possible to conduct with the word line WL to be connected via the protrusion EXb.

(Method of Manufacturing Semiconductor Storage Device)

Next, a method of manufacturing the semiconductor storage device 2 according to the second embodiment will be described with reference to FIGS. 10A to 13C. FIGS. 10A to 13C are flow diagrams illustrating an example of the procedure of the method of manufacturing the semiconductor storage device 2 according to the second embodiment. In FIGS. 10A to 13C, the lower layer structure of the semiconductor storage device 2 is illustrated as an underlayer UL.

Figure 10A:
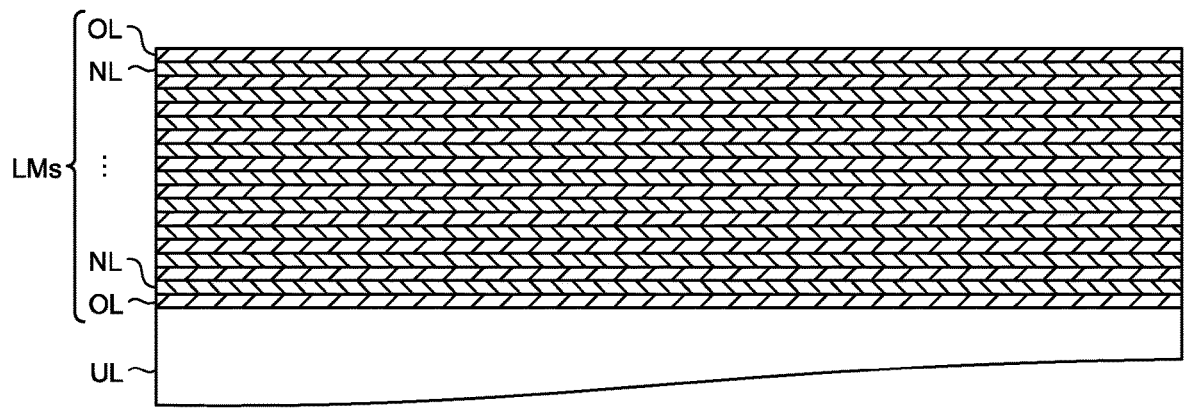
FIGS. 10A to 10C are flow diagrams illustrating an example of a procedure of a method of manufacturing the semiconductor storage device according to the second embodiment.

As illustrated in FIG. 10A, the stacked body LMs in which a plurality of the sacrificial layers NL and a plurality of the insulating layers OL are alternately stacked is formed on the underlayer UL.

Figure 10B:
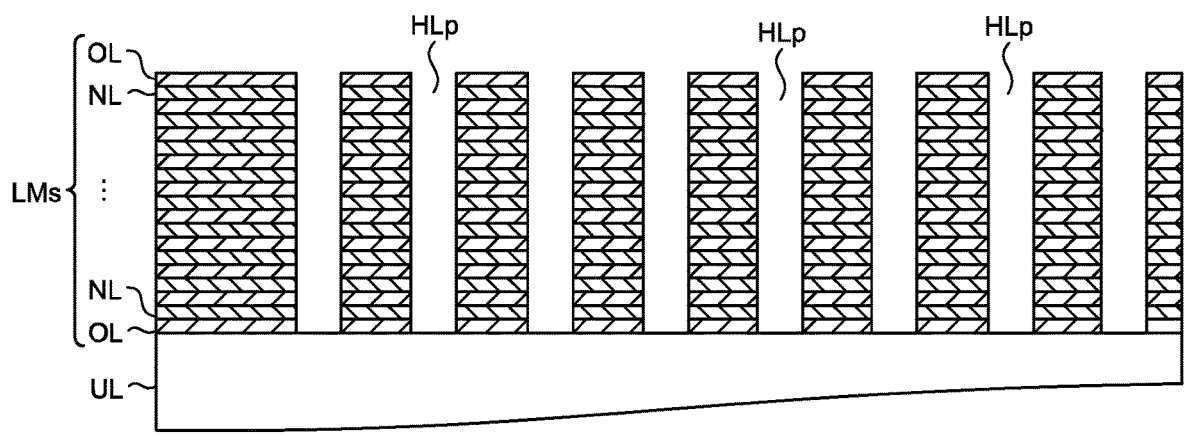

As illustrated in FIG. 10B, the through hole HLp that penetrates the stacked body LMs and reaches the lowermost insulating layer OL is formed.

Figure 10C:
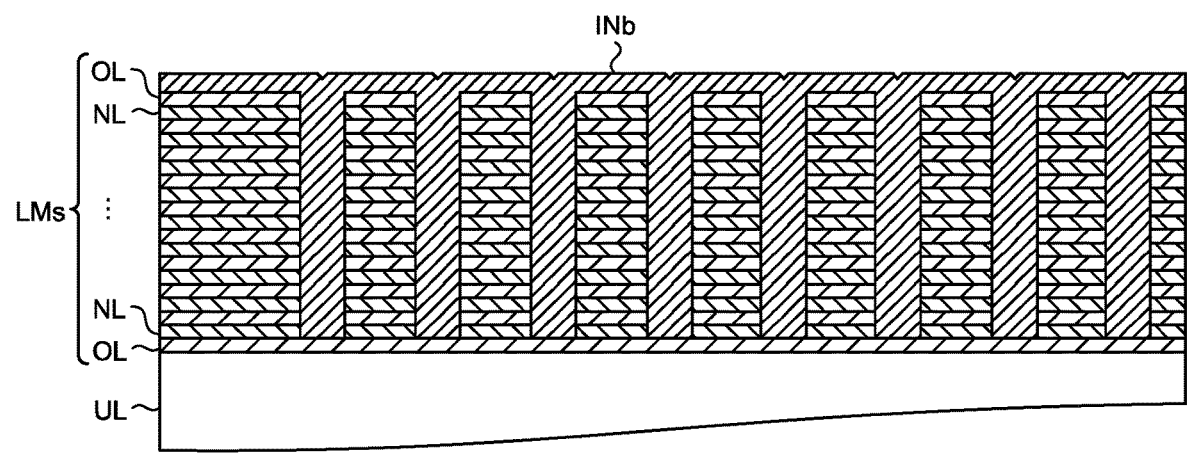

As illustrated in FIG. 10C, the insulating member INb covering the stacked body LMs is formed. At this time, the insulating member INb is formed to be sufficiently thick so that the through hole HLp is filled with the insulating member INb.

Figure 11A:
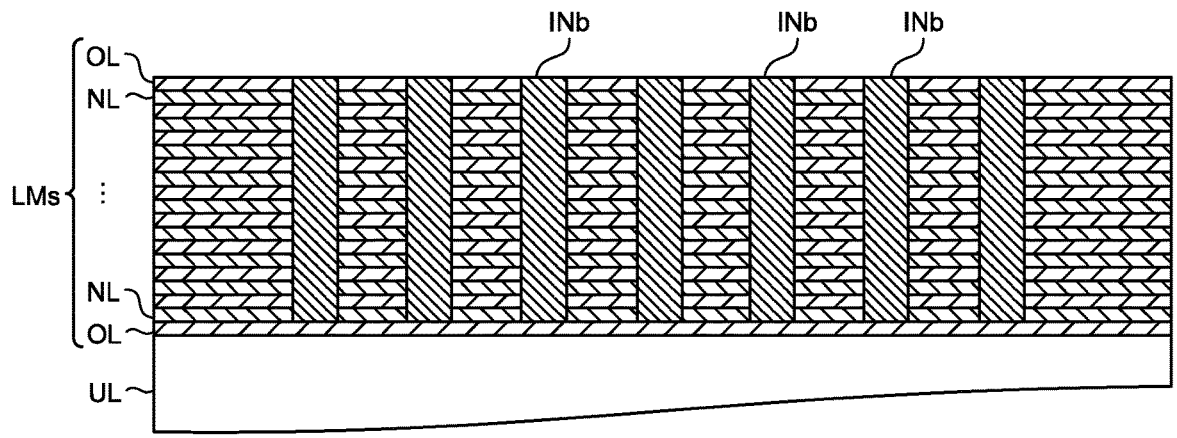
FIGS. 11A to 11C are flow diagrams illustrating an example of the procedure of the method of manufacturing the semiconductor storage device according to the second embodiment.

As illustrated in FIG. 11A, the insulating member INb is etched back to expose the uppermost insulating layer OL of the stacked body LMs. At this time, the etch back condition is adjusted so that the insulating member INb in the through hole HLp is not removed.

Figure 11B:
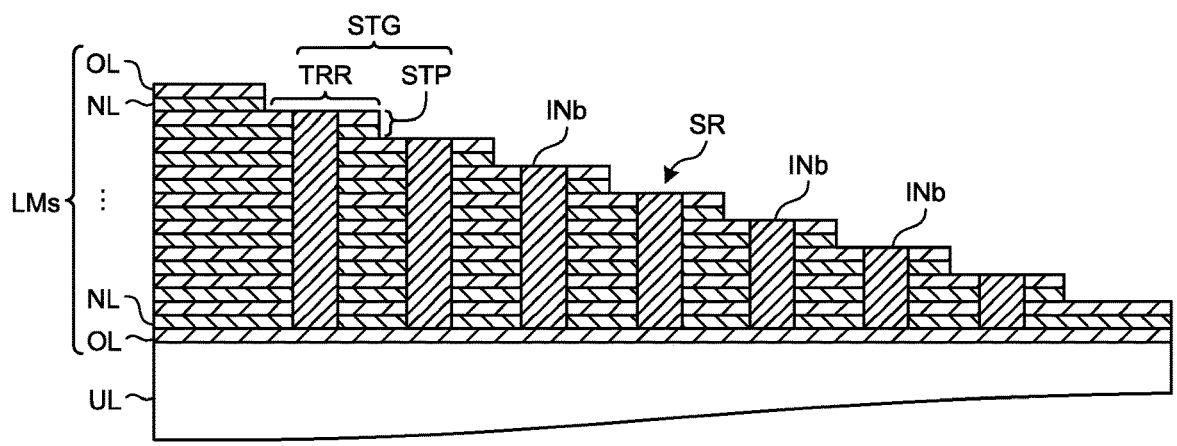

As illustrated in FIG. 11B, the stepped portion SR is formed in the stacked body LMs. As in the first embodiment, the stepped portion SR is formed by repeating the resist slimming and the one by one removal of pairs of the sacrificial layer NL and the insulating layer OL.

Figure 11C:
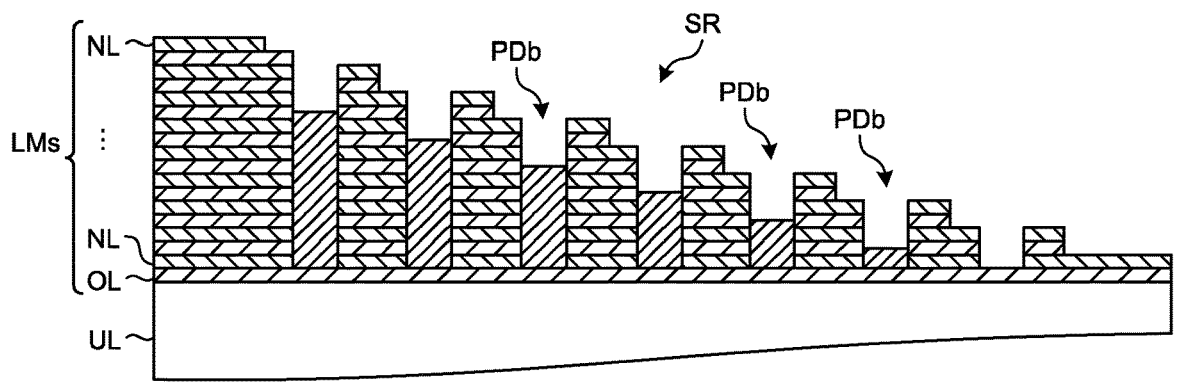

As illustrated in FIG. 11C, the insulating member INb with which the through hole HLp is filled is etched back. As a result, the insulating member INb is recessed from the edge of the through hole HLp to a predetermined depth position in the through hole HLp.

Further, the insulating layer OL composed of the terrace portion TRR has a material similar to that of the insulating member INb. Therefore, while the insulating member INb is etched back, the insulating layer OL composed of the terrace portion TRR is also removed, so that the lower sacrificial layer NL under the insulating layer OL is exposed as a terrace portion TRR face.

In the through hole HLp, two pairs of the sacrificial layers NL and the insulating layers OL, that is, the sacrificial layer NL that constitutes the terrace portion TRR and the insulating layer OL under the sacrificial layer NL, and a pair of the sacrificial layer NL and the insulating layer OL thereunder, are exposed. That is, the insulating member INb in the through hole HLp has a larger etch back amount than the example of the first embodiment.

Unlike the insulating member INa which is thinly formed on the inner wall of the through hole HLp as in first embodiment, the entire through hole HLp is filled with the insulating member INb of the second embodiment. Such an insulating member INb tends to remain on the inner wall of the through hole HLp. Therefore, the etch back amount is increased in order to reliably expose the sacrificial layer NL in the through hole HLp.

As described above, the pedestal PDb is formed at each stage of the stepped portion SR.

Figure 12A:
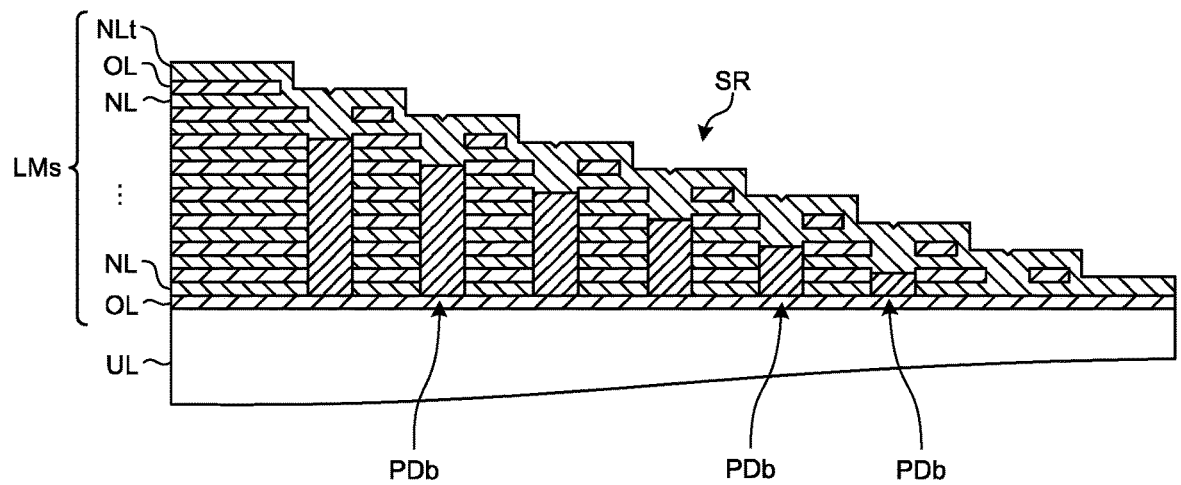
FIGS. 12A to 12C are flow diagrams illustrating an example of the procedure of the method of manufacturing the semiconductor storage device according to the second embodiment.

As illustrated in FIG. 12A, a sacrificial layer NLt that covers the entire stepped portion SR is formed. The sacrificial layer NLt covers the terrace portion TRR of each stage of the stepped portion SR, the inside of the through hole HLp including the pedestal PDb recessed from the terrace portion TRR to a predetermined depth, and the step portion STP. As a result, the entire through hole HLp is filled with the sacrificial layer NLt, which has substantially the same height as the sacrificial layer NLt formed in the terrace portion TRR.

Figure 12B:
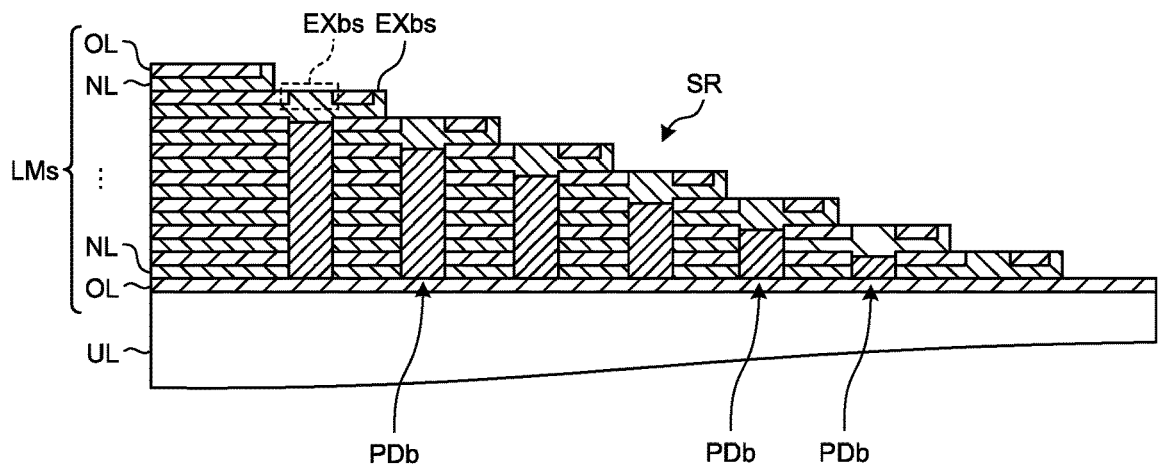

As illustrated in FIG. 12B, the sacrificial layer NLt covering the stepped portion SR is etched back. As a result, the sacrificial layer NLt on the terrace portion TRR and the sacrificial layer NL constituting the terrace portion TRR are both removed, and the lower insulating layer OL is exposed. Therefore, the number of layers of the stacked body LMs is smaller than the originally formed stacked body in FIG. 10A by each one layer of the insulating layers OL and the sacrificial layers NL.

In addition, the sacrificial layer NLt in the through hole HLp has substantially the same height as the upper face of the newly exposed insulating layer OL.

In other words, the sacrificial layer NLt of the unnecessary portion such as the upper face of the terrace portion TRR is removed, and the hole of the through hole HLp generated in the insulating layer OL and the sacrificial layer NL at each stage is backfilled. The backfill portion in the insulating layer OL is a protrusion EXbs of the sacrificial layer NL. Further, the sacrificial layer NL also has the protrusion EXbs in the step portion STP.

Figure 12C:
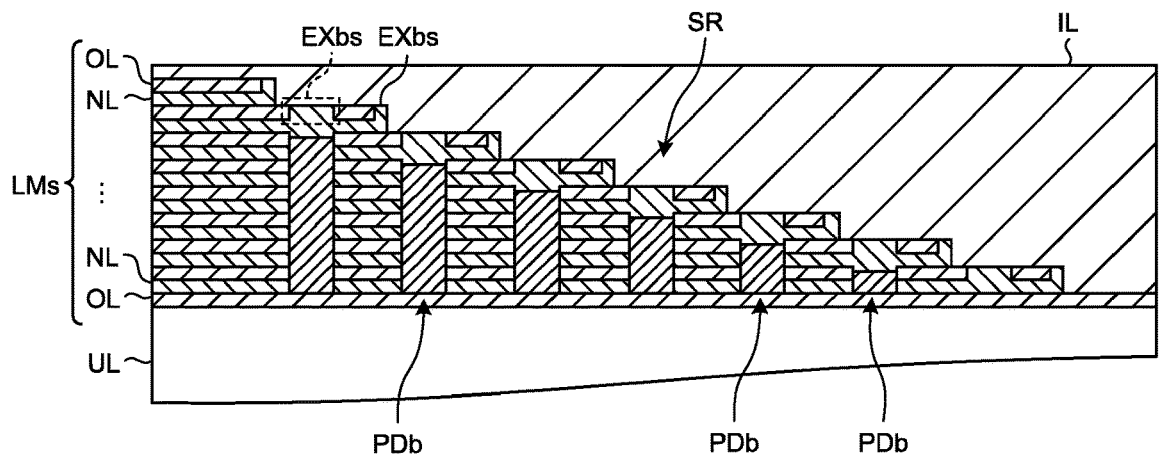

As illustrated in FIG. 12C, the interlayer insulating layer IL covering the entire stepped portion SR is formed. The interlayer insulating layer IL is formed, for example, to a height approximately equal to the height of the uppermost layer of the stacked body LMs in the cell array region CA.

Figure 13A:
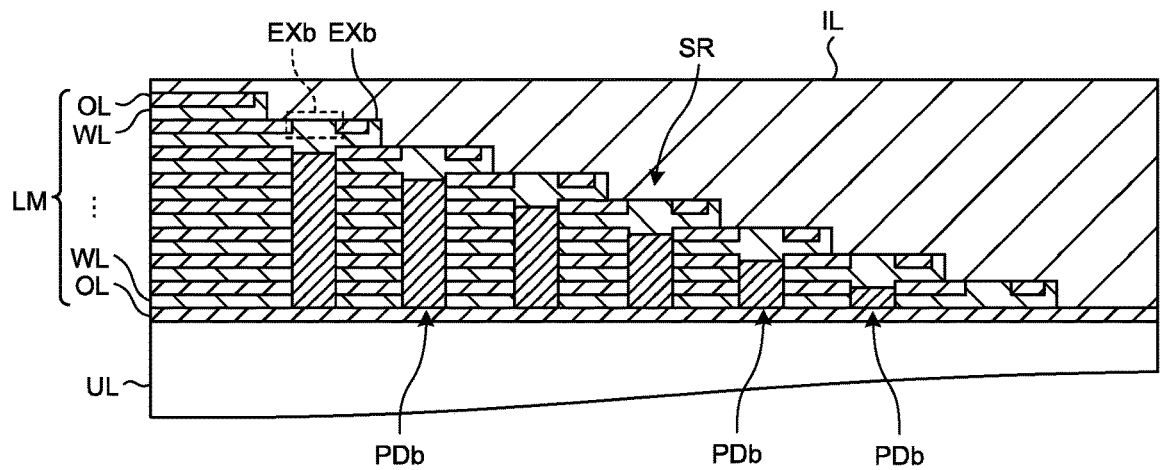
FIGS. 13A to 13C are flow diagrams illustrating an example of the procedure of the method of manufacturing the semiconductor storage device according to the second embodiment.

As illustrated in FIG. 13A, the word line WL is formed by removing the sacrificial layer NL between the insulating layers OL, and filling a space between the insulating layers OL with a conductor such as tungsten. Such a replacement process is performed through a slit (not illustrated) as in the first embodiment.

Figure 13B:
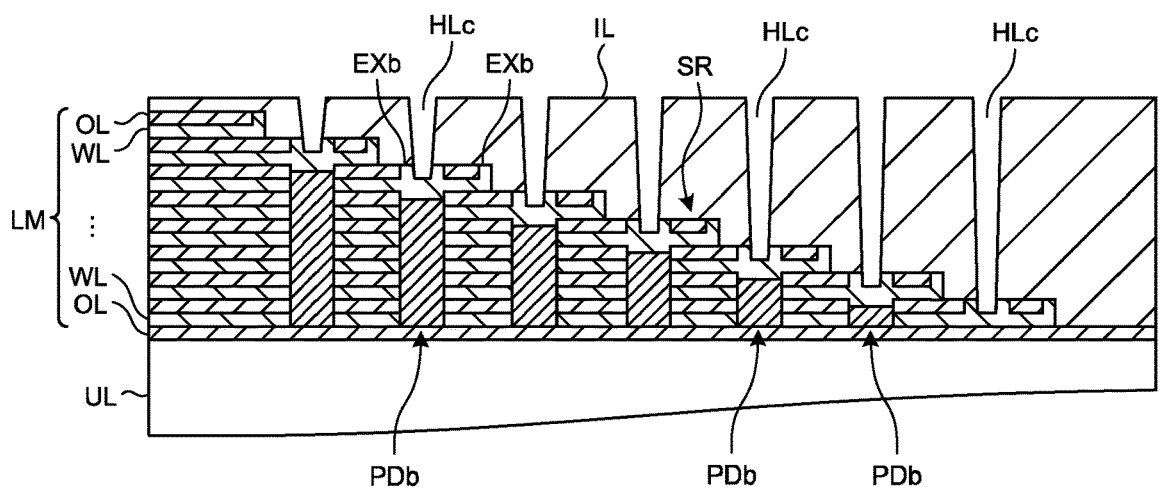

As illustrated in FIG. 13B, the through hole HLc penetrating the interlayer insulating layer IL and the protrusion EXb protruding into the insulating layer OL constituting the terrace portion TRR of each stage, and reaching the lower word line WL is formed at a time.

Figure 13C:
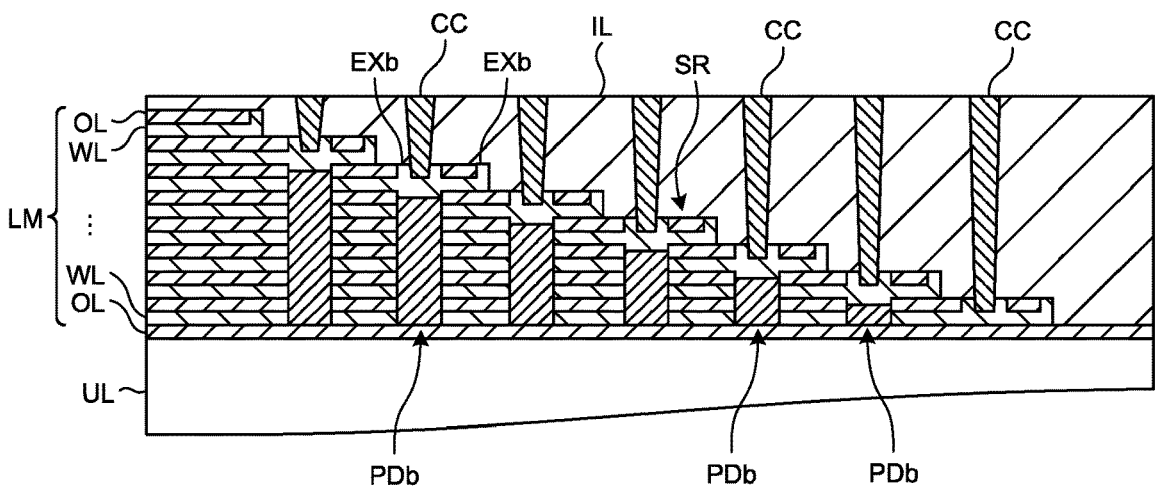

As illustrated in FIG. 13C, the through hole HLc is filled with a conductor such as tungsten, and the contact CC disposed at each stage is formed.

Thereafter, the contact CH connected to a channel layer CHN of the pillar PL, the contact V0 connected to the contact CC of the stepped portion SR, and the upper layer wiring such as the bit line BL are formed.

As described above, the semiconductor storage device 2 of the second embodiment is manufactured.

The semiconductor storage device 2 of the second embodiment has the same effects as the semiconductor storage device 1 of the first embodiment described above.

According to the semiconductor storage device 2 of the second embodiment, the word line WL to which the contact CC is connected is thickened by the protrusion EXb that protrudes into the insulating layer OL. This makes it easy to suppress the word line WL to be connected to the contact CC from being penetrated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
    a stacked body in which a plurality of conductive layers and a plurality of insulating layers are alternately stacked, the stacked body including a stepped portion in which ends of the plurality of conductive layers are stepped;
    a pillar penetrating the stacked body, the pillar having a memory cell at a height position of each of the plurality of conductive layers;
    a contact disposed at the stepped portion, the contact being connected to an n-th conductive layer when counted from a lowermost conductive layer of the plurality of conductive layers where n is an integer of 2 or more; and
    a region in an (n−1)th conductive layer when counted from the lowermost conductive layer of the plurality of conductive layers, the region being disposed at a position below the contact, the region being insulated from the (n−1)th conductive layer surrounding a periphery.

2. The semiconductor storage device according to claim 1, wherein
    the region includes
    a conductive member embedded in the (n−1)th conductive layer, and
    an insulating member surrounding the conductive member.

3. The semiconductor storage device according to claim 1, wherein
    the region
    includes an insulating member embedded in the (n−1)th conductive layer.

4. The semiconductor storage device according to claim 1, wherein
    the region
    extends to a conductive layer below the (n−1)th conductive layer.

5. The semiconductor storage device according to claim 4, wherein
    the region
    extends to the lowermost conductive layer.

6. The semiconductor storage device according to claim 4, wherein
    the region
    does not reach the lowermost conductive layer.

7. The semiconductor storage device according to claim 1, wherein
    a contact is connected to each of conductive layers above the n-th conductive layer, and
    in each of conductive layers above the (n−1)th conductive layer, the region is disposed at a position below a contact connected to a conductive layer which is one layer above the each conductive layer.

8. The semiconductor storage device according to claim 7, wherein
    a contact is connected to each of conductive layers below the n-th conductive layer, and
    the region is not disposed in any of the conductive layers below the (n−1)th conductive layer.

9. The semiconductor storage device according to claim 1, wherein
    the n-th conductive layer
    includes, at an end of the stepped portion, a protrusion that protrudes to a step portion of a stage to which the n-th conductive layer belongs.

10. The semiconductor storage device according to claim 1, wherein
    the n-th conductive layer
    includes a protrusion surrounding a periphery of the contact.

11. A method of manufacturing a semiconductor storage device, the method comprising:
- forming a stacked body in which a plurality of first insulating layers and a plurality of second insulating layers that is later replaced with conductive layers are alternately stacked;
- forming a through hole penetrating an (n−1)th second insulating layer when counted from a lowermost second insulating layer of the plurality of second insulating layers where n is an integer of 2 or more;
- forming, in the through hole, a region to be insulated from the (n−1)th conductive layer surrounding a periphery when the second insulating layers are replaced with the conductive layers;
- forming, in the stacked body, a stepped portion in which ends of the plurality of second insulating layers are stepped; and
- forming, above the region in the (n−1)th conductive layer, a contact to be connected to an n-th second insulating layer when counted from a lowermost second insulating layer of the plurality of second insulating layers.

12. The method of manufacturing a semiconductor storage device according to claim 11, wherein
forming the region includes
forming an insulating member covering an inner wall of the through hole, and
filling a region surrounded by the insulating member with a conductive member.

13. The method of manufacturing a semiconductor storage device according to claim 11, wherein
forming the region includes
filling the through hole with an insulating member.

14. The method of manufacturing a semiconductor storage device according to claim 11, wherein
forming the through hole includes
penetrating layers from an uppermost second insulating layer to at least the (n−1)th second insulating layer, and
forming the stepped portion includes
backfilling a portion of the through hole opened in the n-th second insulating layer with an insulating material equivalent to an insulating material of the second insulating layer.

15. The method of manufacturing a semiconductor storage device according to claim 14, wherein
forming the through hole includes
penetrating a second insulating layer below the (n−1)th second insulating layer.

16. The method of manufacturing a semiconductor storage device according to claim 15, wherein
forming the through hole includes
penetrating layers up to the lowermost second insulating layer.

17. The method of manufacturing a semiconductor storage device according to claim 15, wherein
forming the through hole includes
not reaching the lowermost second insulating layer.

18. The method of manufacturing a semiconductor storage device according to claim 11, wherein
forming the region includes
forming the region in each of second insulating layers above the (n−1)th second insulating layer, and
forming the contact includes
forming the contact above the region in each of conductive layers above the n-th conductive layer.

19. The method of manufacturing a semiconductor storage device according to claim 18, wherein
forming the contact includes
forming a contact connected to each of conductive layers below the n-th conductive layer.

20. The method of manufacturing a semiconductor storage device according to claim 19, wherein
forming the region includes
not forming the region in a second insulating layer below the (n−1)th second insulating layer.

* * * * *